United States Patent [19]
Phillips

[11] 3,932,299
[45] Jan. 13, 1976

[54] METHOD FOR THE REDUCTION OF IRON IN IRON-DOPED LITHIUM NIOBATE CRYSTALS

[75] Inventor: William Phillips, Princeton, N.J.

[73] Assignee: RCA Corporation, New York, N.Y.

[22] Filed: Dec. 3, 1973

[21] Appl. No.: 420,784

Related U.S. Application Data

[63] Continuation-in-part of Ser. No. 302,185, Oct. 30, 1972, abandoned.

[52] U.S. Cl. .............. 252/300; 96/90 PC; 96/27 H; 340/173 LS; 350/3.5; 350/150; 350/160 R; 350/160 P; 423/594; 423/641
[51] Int. Cl.² ......................................... G11C 17/00
[58] Field of Search.................. 252/501, 300, 62.1; 350/3.5, 150, 160 R, 160 P; 423/592, 593, 423/594, 641; 340/173 LS; 96/90 PC, 27 H

[56] References Cited
UNITED STATES PATENTS

| | | | |
|---|---|---|---|
| 3,544,189 | 12/1970 | Chen et al. | 350/3.5 |
| 3,700,912 | 10/1972 | Glass | 350/160 R |
| 3,703,328 | 11/1972 | Glass | 350/3.5 |
| 3,773,400 | 11/1973 | Amodei | 350/3.5 |
| 3,799,642 | 3/1974 | Phillips et al. | 350/160 P |

OTHER PUBLICATIONS

Phillips et al., RCA Review, Vol. 33, Mar. 1972, pp. 94–109.
Petersen et al., App. Phys. Lett., Vol. 19, No. 5, 9/1971, pp. 130–132.

*Primary Examiner*—Benjamin R. Padgett
*Assistant Examiner*—R. E. Schafer
*Attorney, Agent, or Firm*—Glenn H. Bruestle; Birgit E. Morris

[57] ABSTRACT

Lithium niobate single crystals doped with iron can be treated to reduce trivalent iron to divalent iron without reduction of the lithium niobate host crystal, by surrounding the crystal with a high-melting salt of lithium, such as lithium carbonate, and heating in an oxygen-containing atmosphere until the desired amount of reduction is obtained.

8 Claims, 3 Drawing Figures

METHOD FOR THE REDUCTION OF IRON IN IRON-DOPED LITHIUM NIOBATE CRYSTALS

This application is a continuation-in-part of my copending application Ser. No. 302,185, filed Oct. 30, 1972, now abandoned.

This invention relates to improved holographic recording media. More particularly, this invention relates to improved iron-doped lithium niobate crystals for use as holographic recording media and method for producing the same.

The invention herein described was made in the course of or under a contract with the Department of the Navy.

BACKGROUND OF THE INVENTION

Thick phase or volume holograms can be recorded in electro-optic single crystals through diffusion or drift of free carriers which are photo-excited from deep traps. During exposure to a modulated light pattern derived from two intersecting coherent light beams, excess photo-excited electrons are produced in regions of high illumination which migrate from those regions to regions of low illumination and are then trapped by impurity ions in the crystal. For example, holograms can be recorded by generating an interference pattern through interaction between a coherent reference beam and an object beam, the latter carrying spatial modulation corresponding to the image to be recorded. The resulting redistribution of electrons produces a corresponding electric field which causes a change in the index of refraction of the crystal medium. The resultant holographic interference pattern is a stationary, high intensity field produced in the region of overlap between the object beam and the reference beam.

This holographic recording method can achieve high density, noise free recording for various memory and display applications. A more detailed discussion of the recording of phase holograms in single crystal electro-optic materials may be found by referring to the following references: Chen et al., Applied Phys. Letters, Vol. 13, p. 223 (1968); Townsend et al., Journal of Applied Physics, Vol. 11, p. 5188 (1970); and Amodei, Applied Phys. Letters, Vol. 18, p. 22 (1971).

The recorded hologram is read out by coherent light which traverses the crystal medium in the direction of the reference beam and is phase modulated in accordance with the recorded pattern and reproduces the object beam through wavefront reconstruction. During readout of unfixed holograms, the electrons are re-excited out of the traps and redistributed evenly throughout the volume of the crystal, thereby removing the field and erasing the holograms.

In order to obtain improved diffraction efficiency of recorded holograms in electro-optic crystals, the concentration of trapping centers can be increased by increasing the number of impurity ions in the crystal. The sensitivity of the holograms, i.e., the amount of energy required to store a hologram, also depends on the concentration of traps, since they determine the electron generation rate during recording.

Lithium niobate single crystals are known as electro-optic materials useful as holographic recording media which have fairly good sensitivity. The sensitivity, as well as the diffraction efficiency, can be greatly improved by doping such crystals with iron, as has been disclosed in a copending application of Amodei and Phillips, Ser. No. 196,733, filed Nov. 8, 1971, now abandoned. For example, iron-doped lithium niobate crystals have 500 times the recording sensitivity and ten times the diffraction efficiency of undoped crystals.

Iron-doped lithium niobate single crystals can be made by the Czochralski technique whereby approximately equimolar amounts of lithium carbonate and niobium pentoxide are admixed and charged to a platinum crucible. The materials are fused and the desired amount of iron oxide added. The crucible is placed in a resistance heated growing furnace and the melt maintained at about 1260°C. Growth is initiated about a seed crystal, usually c axis oriented. The crystal is pulled from the melt at a rate of about 5mm/hr., preferably while rotating the crystal at 10–30 rpm. When growth is terminated, the crystal is annealed in an isothermal environment at about 1100°C. for 4-5 hours and slowly (50°C. per hour) cooled to room temperature.

Following growth and annealing, the crystals are poled by heating to about 1200°C. in an oxygen-containing atmosphere and passing a small electric current through them, e.g., about 2 ma./cm$^2$ of cross-sectional area. Since the application of a current tends to reduce the crystals, they are allowed to anneal in oxygen for several hours after poling at a temperature of about 950°–1000°C. and then slowly cooled to room temperature.

For high sensitivity and read-write performance, the erase sensitivity should be as high as the record sensitivity. Normal iron-doped lithium niobate crystals poled and annealed as described above contain iron mainly in the trivalent state and have from three to twenty times lower erase sensitivity than record sensitivity. Thus for optimum erase sensitivity, most of the iron must be reduced to the divalent state. In the past this has been done by heating the doped crystal in an inert gas, such as argon, with a low partial pressure of oxygen. This method is useful when a fraction of the trivalent iron is to be reduced, but when increased reduction is required, the lithium niobate host crystal is reduced as well. The amount of reduction that can be obtained by heating in argon is directly proportional to the heating temperature and is inversely proportional to the total amount of iron present. Heating temperatures are limited to about 1150°C.; heating above that temperature results in depoling of the crystals. For lightly doped crystals, reduction of up to about 90% of the iron present can be achieved, but much less reduction is obtained by this method with increasing iron content or with larger crystals.

Reduction of the lithium niobate crystal itself creates an optical absorption that overlaps the absorption of divalent iron and interferes with the hologram storage. The electrical conductance of the crystal is increased, giving rise to an increased rate of thermal decay of stored holograms, and adversely affecting the lifetime of stored holograms. Thus a new method of reducing the iron in lithium niobate crystals whereby almost all of the iron is reduced to the divalent state without concomitantly reducing the lithium niobate is highly desirable for rapid erasure of information stored in these crystals.

SUMMARY OF THE INVENTION

We have found that when iron-doped lithium niobate crystals are treated by heating while surrounded by certain lithium salt powders in an oxygen atmosphere, almost all of the trivalent iron can be reduced to divalent iron without adversely affecting the lithium niobate crystals. Further, the amount of reduction can be precisely regulated by proper choice of reaction conditions.

DETAILED DESCRIPTION OF THE INVENTION

The iron-doped lithium niobate single crystals useful herein contain various amounts of iron, depending on the final application for which the crystals are to be used. Moderately or heavily doped lithium niobate crystals, i.e., those containing from about 0.005 up to about 0.1 mol percent of iron, are presently preferred for read only memories wherein the holographic information is fixed or permanent. Lithium niobate crystals containing smaller amounts of iron, i.e., from about 0.0001 to 0.005 mol percent of iron, are presently preferred for write-erase systems wherein the holographic information is to be continually updated or changed. For high erase sensitivity, over 90% and preferably over 98.5% of the iron present must be in the divalent state.

Figure 1:
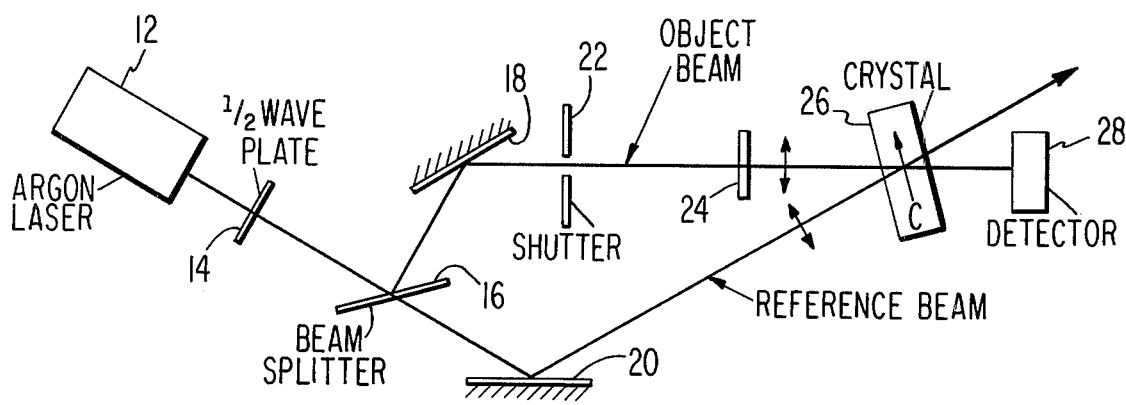
FIG. 1 is a schematic drawing of a system for recording and reading holographic information in electro-optic crystals and for testing sensitivity of electro-optic crystals.

Referring to FIG. 1, there is shown schematically a system useful for recording and reading holographic information in an electro-optic crystal. The system comprises an argon laser 12 which emits coherent light of a wavelength of 4880A. This light passes through a one-half wave plate 14 to obtain coherent light which is horizontally polarized. The light then passes through a beam splitter 16. A portion of this radiation is reflected from the beam splitter onto a first mirror 18 and the other portion of the radiation passes through the beam splitter onto a second mirror 20. The mirrors 18 and 20 are adjusted such that the plane polarized beams reflected from them meet at an angle of 30°. The portion of the beam which is reflected from the beam splitter is called the object beam. After being reflected from the mirror 18 the object beam passes through a shutter 22 and then through the object 24. The portion of the beam which passes through the beam splitter 16 is called the reference beam. The reference beam and the object beam intersect to form an interference pattern. The electro-optic crystal 26 is positioned at the intersection of the reference beam and the object beam such that the crystallographic c axis is perpendicular to the bisector of the 30°angle between the reference and object beams. The crystals are cut and polished with parallel faces containing the c axis. The polarization direction of the object and reference beams is horizontal, i.e., in the plane of incidence, as is the c axis of the crystal.

The recorded holographic pattern is read out by closing the shutter, thereby blocking the object beam and allowing only the reference beam to impinge on the crystal. An image of the object will thereby be formed and may be viewed either spatially or, alternatively, on a detector 28 which can be, for example, a silicon solar cell or an image screen.

When the electro-optic crystal is iron-doped lithium niobate, an argon laser having an emission of 4880A is particularly suitable for recording the holographic information on the crystal, although lasers emitting at other wavelengths can also be used.

In preparing the improved holographic media described herein, the iron-doped lithium niobate crystals to be treated to reduce trivalent iron to divalent iron are surrounded by a powder of a high melting salt of lithium. Suitable lithium salts should remain solid at the heating temperatures employed and include lithium carbonate, lithium silicate, lithium aluminate, lithium oxide, lithium fluoride and the like. The crystal and the lithium salt are charged to a crucible, suitably of platinum or other inert material, and heated under an oxygen-atmosphere until the desired reduction has taken place.

Heating is carried out in an oxygen-containing atmosphere such as air or oxygen. Preferably a slow stream of oxygen is maintained during heating. The presence of oxygen serves to prevent the reduction of the lithium niobate crystal, believed to occur from the loss of oxygen atoms from the crystal surface, thereby releasing electrons according to the equation $2O^- \rightarrow O_2 \uparrow +4e^-$. Surprisingly, the presence of the oxidizing gas does not prevent the reduction of the trivalent iron within the crystal.

The temperature of heating will vary with the amount of iron present; higher temperatures are required for increasing amounts of iron. For example, for a crystal containing about 0.01 mol percent of iron or less, a temperature of about 450°–550°C. may be required to reduce most of the iron present. For a crystal containing higher amounts of iron of about 0.05 or more mol percent of iron, temperatures up to about 600°C. are required. For crystals containing amounts of iron in the range 0.03 to 0.1 mol percent, higher temperatures will be required for nearly complete conversion of iron to the divalent state, up to about 1000°C.

Iron-doped lithium niobate crystals containing over about 90% of the total iron present as divalent iron could not be made according to prior art methods without also reducing the lithium niobate crystal lattice as well. Thus novel lithium niobate crystals described herein comprise single crystals containing iron, i.e., from about 0.0001 to about 0.1 mol percent of iron, wherein at least 90% of the iron is in the divalent state and substantially all of the optical absorption is derived from the divalent iron. These crystals are particularly useful in write-erase memories where rapid updating of information is required.

The invention will be further illustrated by the following examples but it is to be understood that the invention is not meant to be limited to the details described therein. In the examples, percent is mol percent.

The initial iron concentration is estimated from the amount of iron added to the melt from which the lithium niobate crystal was grown. The amount can be confirmed by electron paramagnetic resonance (EPR) analysis of oxidized crystals. The divalent iron content of a reduced crystal is determined by comparing its optical absorption with an optical absorption curve calibrated from a series of crystals of known divalent iron content determined by measuring the change in EPR signal.

EXAMPLE 1

Several lithium niobate crystals were packed in lithium carbonate powder in a platinum crucible. The uncovered crucibles were heated in an oxygen furnace at 600°C. for 48 hours. The trivalent iron was substantially reduced to divalent iron, as can be seen from the following data:

| Sample | Mol % Iron | Initial $Fe^{+3}$ concentration $cm^{-1}$ | Final $Fe^{+2}$ concentration $cm^{-1}$ | Percent Reduction |
|---|---|---|---|---|
| 1 | 0.03 | $3 \times 10^{18}$ | $7 \times 10^{17}$ | 25% |
| 2 | 0.001 | $3 \times 10^{17}$ | $2 \times 10^{17}$ | 66% |
| Control | <0.0005 | $10^{17}$ | $10^{17}$ | 100% |

The full conversion of the control sample was confirmed by observing that its dynamic range was extremely small.

EXAMPLE 2

Figure 2:
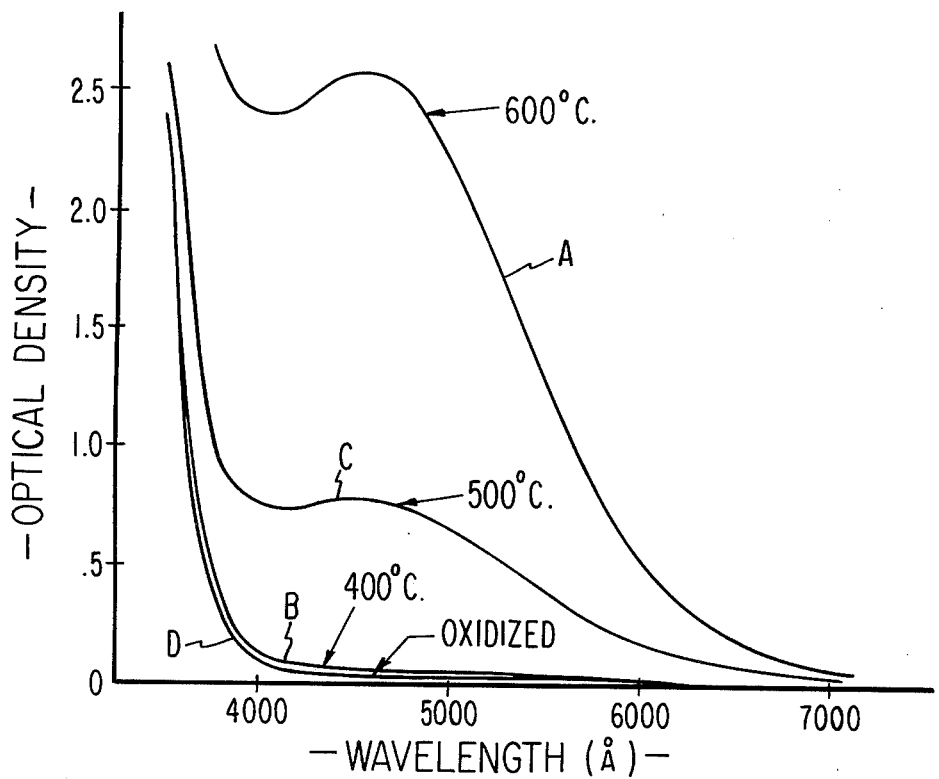
FIG. 2 is a graph showing a comparison of optical absorption spectra of untreated iron-doped lithium niobate crystals and treated iron-doped lithium niobate crystals.

The procedure of Example 1 was followed employing lithium niobate crystals containing 0.053 mol percent iron as determined by EPR measurement and heating at various temperatures. The results are shown in FIG. 2, which is a graph of optical density. The maximum coloration at about 2.5 corresponds to nearly complete conversion of trivalent iron to divalent iron, as verified by EPR techniques. Referring now to FIG. 2, nearly complete conversion is achieved by heating a crystal at 600°C., designated as Curve A; little conversion occurs at 400°C., designated as Curve B; and about one-half conversion occurs at 500°C., designated as Curve C. Curve D shows, as a control, a lithium niobate crystal containing 0.015 % iron which was heated in oxygen without packing in lithium carbonate.

EXAMPLE 3

Figure 3:
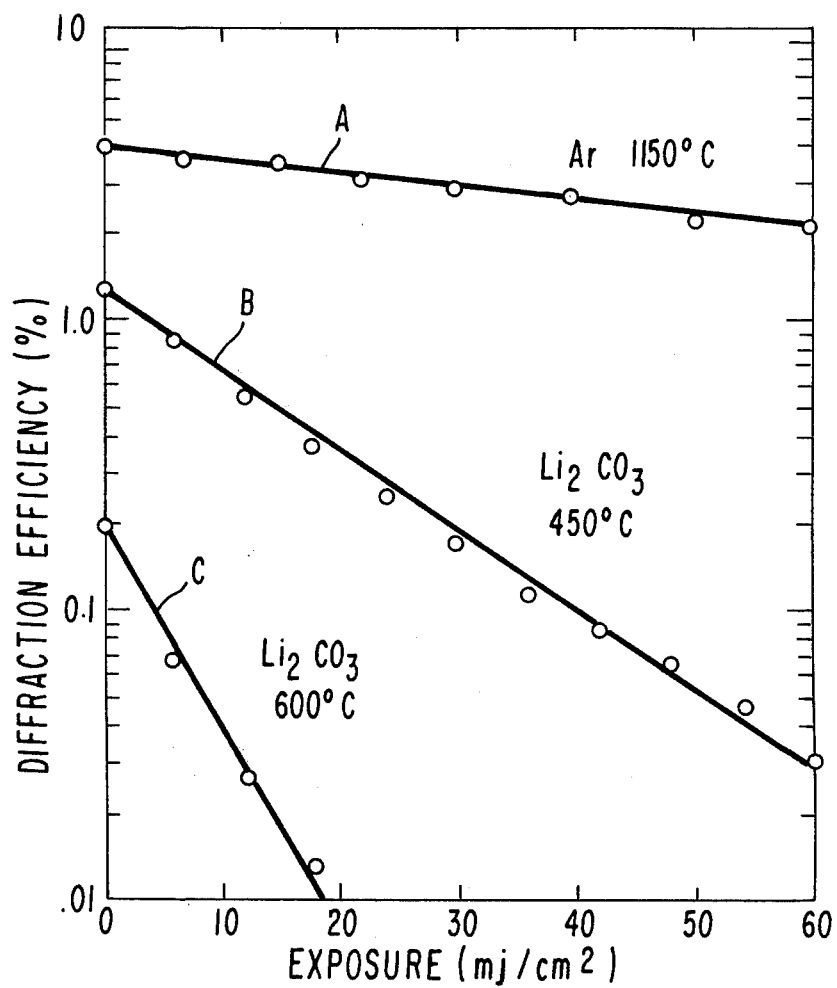
FIG. 3 is a graph showing a comparison of diffraction efficiency versus exposure, or erase sensitivity, of iron-doped lithium niobate crystals which have been variously treated to reduce the iron.

Three crystals each containing 0.0025 mol percent iron as determined by EPR measurement were treated to reduce the iron. Referring now to FIG. 3, the amount of reduction that can be achieved by heating in a lithium salt is far greater than that attainable by heating in argon as determined from the erase sensitivity of the crystals. Curve A shows, as a control, an almost flat curve for erasure rate, or diffraction efficiency versus exposure, for the crystal heated in argon at 1150°C. Curve B shows a much steeper curve for a crystal heated in lithium carbonate at 450°C. and Curve C shows a still steeper curve for a crystal heated in lithium carbonate at 600°C. It is estimated that the crystal indicated by Curve C has only about 0.07 times the trivalent iron concentration as the crystal indicated by Curve A, or less than about $7 \times 10^{15}$ $Fe^{+3}/cm^{3}$. This corresponds to a reduction of over 98.5% of the total iron present in the crystal.

EXAMPLES 4–6

The procedure of Example 1 was followed, except surrounding the lithium niobate crystals with lithium fluoride, lithium silicate and lithium aluminate in place of lithium carbonate.

Similar results were obtained.

I claim:

1. A method of reducing over 90 percent of the trivalent iron present in an iron-doped lithium niobate crystal to divalent iron without reducing the lithium niobate which comprises surrounding an iron-doped lithium niobate crystal in a salt of lithium and heating at a temperature of at least about 400°C up to about 1000°C but below the melting point of said lithium salt in an oxygen-containing atmosphere.

2. A method according to claim 1 wherein the temperature is from about 450° to about 600°C.

3. A method according to claim 1 wherein the lithium salt is lithium carbonate.

4. A method according to claim 1 wherein the lithium niobate crystal contains up to about 0.005 mol percent of iron and the temperature of heating is from about 450° to about 550°C.

5. A method according to claim 1 wherein the lithium niobate crystal contains from about 0.005 to 0.1 mol percent of iron and the temperature of heating is from about 550° to about 1000°C.

6. A method according to claim 1 wherein the lithium niobate crystal contains from about 0.0001 to 0.005 mol percent of iron and is heated at a temperature of about 450° to about 550°C. while surrounded with lithium carbonate.

7. A crystal useful for recording and erasing phase holograms optically comprising a single crystal of lithium niobate doped with from about 0.0001 to about 0.005 mol percent of iron wherein over about 98.5 mol percent of the iron present is in the divalent state and wherein substantially all of the visible optical absorption is derived from divalent iron.

8. A crystal useful for recording and erasing phase holograms optically comprising a single crystal of lithium niobate doped with from about 0.001 to about 0.005 mol percent of iron wherein over about 90 mol percent of the iron present is in the divalent state and wherein substantially all of the visible optical absorption is derived from divalent iron.

* * * * *